US 8,502,445 B2
Aug. 6, 2013

(12) United States Patent
Levermore et al.

(10) Patent No.: US 8,502,445 B2
(45) Date of Patent: Aug. 6, 2013

(54) RGBW OLED DISPLAY FOR EXTENDED LIFETIME AND REDUCED POWER CONSUMPTION

(75) Inventors: Peter Levermore, Lambertville, NJ (US); Woo-Young So, Richboro, PA (US); Michael Weaver, Princeton, NJ (US); Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/185,063

(22) Filed: Jul. 18, 2011

(65) Prior Publication Data
US 2013/0020933 A1  Jan. 24, 2013

(51) Int. Cl.
*H01L 51/00* (2006.01)
(52) U.S. Cl.
USPC .............................. 313/504; 345/76
(58) Field of Classification Search
USPC ................... 313/504, 506; 345/76
See application file for complete search history.

(56) References Cited

U.S. PATENT DOCUMENTS

| 4,769,292 | A | 9/1988 | Tang et al. |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,250,226 | B2 * | 7/2007 | Tokito et al. ................. 428/690 |
| 7,279,704 | B2 | 10/2007 | Walters et al. |
| 7,431,968 | B1 | 10/2008 | Shtein et al. |
| 2003/0230980 | A1 | 12/2003 | Forrest et al. |
| 2004/0174116 | A1 | 9/2004 | Lu et al. |
| 2005/0225232 | A1 * | 10/2005 | Boroson et al. ............... 313/504 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Karabi Guharay
(74) *Attorney, Agent, or Firm* — Sterne, Kessler, Goldstein & Fox PLLC

(57) ABSTRACT

A first device is provided that includes a first light source that has at least one organic light emitting device that may emit near white light having a correlated color temperature (CCT) that is less than 6504K. The first device may also have a plurality of pixels comprising a first sub-pixel having a color filter in optical communication with the first light source that passes light having a peak wavelength between 400 and 500 nm. A second sub-pixel having a color filter in optical communication with the first light source that passes light having a peak wavelength between 500 and 580 nm. A third sub-pixel having a color filter in optical communication with the first light source that passes light having a peak wavelength between 580 and 700 nm. A fourth sub-pixel that emits near white light that may have a CCT that is less than 6504 K.

22 Claims, 9 Drawing Sheets

U.S. PATENT DOCUMENTS

2006/0105198 A1  5/2006  Spindler et al.
2008/0258606 A1* 10/2008 Butler et al. .................. 313/504
2010/0013748 A1  1/2010  Cok et al.
2010/0289727 A1* 11/2010 Miller et al. .................... 345/76

OTHER PUBLICATIONS

Baldo et al., "Very high-efficiency green organic light-emitting devices based on electrophosphorescence," Appl. Phys. Lett., vol. 75, No. 3, 4-6 (1999).

GTI Truelight Truecolor, "Explanation of Various Light Sources and Their Use in Visual Color Matching Aplications," by GTI Graphic Technology, Inc., 4 pages.

J.P. Spindler et al., "System Considerations for RGBW OLED Displays;" Journal of the Society for Information Display, vol. 14.1; p. 37 (2006).

J.P. Spindler et al., "Lifetime-and Power-Enhanced RGBW Displays Based on White OLEDs;" Journal of the Society for Information Display; p. 36 (2005).

S.A. Van Slyke, "Advanced Active Matrix OLED Technologies," Display and Components OLED Modules Business Unit, Eastman Kodak Company Rochester, New York, USA, Intertech (2004), pp. 1-31.

Hack et al. "High Efficiency Phosphorescent AMOLEDs: The Path to Long Lifetime TVs," Journal of the Society for Information Display, vol. 42.1 (May 15, 2011), 4 pages.

Kawamura et al., New Deep Blue Fluorescent Materials and Their Application to High Performance OLEDs, Proc. Soc. Inf. Disp. Tech. Papers, p. 829 (2011).

* cited by examiner

RGBW OLED DISPLAY FOR EXTENDED LIFETIME AND REDUCED POWER CONSUMPTION

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

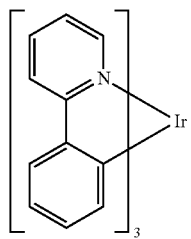

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments provide a red, green, blue, and white (RGBW) OLED display design that may provide extended lifetime and/or reduced power consumption. A first device is provided that includes a first light source that has at least one organic light emitting device. The first light source may emit light having a correlated color temperature (CCT) that is less than 6504K. The first device may also comprise a plurality of pixels. Each of the pixels may comprise a first sub-pixel comprising a first color filter in optical communication with the first light source. The first color filter may be adapted to pass light from the first light source having a peak wavelength in the visible spectrum between 400 and 500 nm. Each of the pixels of the first device may also comprise a second sub-pixel having a second color filter in optical communication with the first light source. The second color filter may be adapted to pass light from the first light source that has a peak wavelength in the visible spectrum between 500 and 580 nm. Each of the pixels of the first device may also comprise a third sub-pixel having a third color filter in optical communication with the first light source. The third color filter may be adapted to pass light from the first light source having a peak wavelength in the visible spectrum between 580 and 700 nm. Each of the pixels of the first device may also comprise a fourth sub-pixel that emits near white light. The near white light may have a CCT that is less than 6504 K.

In some embodiments, in the first device as described above, the fourth sub-pixel does not comprise a color filter. In some embodiments, in the first device as described above, the chromaticity of the first light source is substantially the same as the chromaticity of the light emitted by the fourth sub-pixel. In some embodiments, in the first device as described above, the fourth sub-pixel emits light that has a first point on the CIE 1931 XYZ color space chromaticity diagram within a first area defined by $CIE_X$=0.315 to 0.350, $CIE_Y$=0.330 to 0.360.

In some embodiments, in the first device as described above, the fourth sub-pixel emits light that has a first point on the CIE 1976 (L*, u*, v*) color space chromaticity diagram that lies within a Duv distance of 0.010 from the Planckian locus. Preferably, the fourth sub-pixel emits light that has a first point on the CIE 1976 (L*, u*, v*) color space chromaticity diagram that lies within a Duv distance of 0.005 from the Planckian locus. More preferably, the fourth sub-pixel emits light that has a first point on the CIE 1976 (L*, u*, v*) color space chromaticity diagram that lies within a Duv distance of 0.002 from the Planckian locus.

In some embodiments, in the first device as described above, the fourth sub-pixel emits light that has a CCT that is greater than 4000 K and less than 6504 K. In some embodiments, the fourth sub-pixel emits light that has a correlated color temperature that is greater than 4000 K and less than 6400 K. In some embodiments, the fourth sub-pixel emits light that has a correlated color temperature that is greater than 4000 K and less than 5600 K. In some embodiments, the fourth sub-pixel emits light that has a correlated color temperature that is greater than 4000 K and less than 5200 K. In some embodiments, the fourth sub-pixel emits light that has a correlated color temperature that is greater than 4000 K and less than 4800 K. In some embodiments, the fourth sub-pixel emits light that has a correlated color temperature that is greater than 5800 K and less than 6200 K.

In some embodiments, the first device as described above is a display comprising a white balance having chromaticity that is approximately equal to the chromaticity of the light emitted from the fourth sub-pixel.

In some embodiments, where the first device as described above is a display having a white balance, the white balance has a first point on the CIE 1976 (L*, u*, v*) color space chromaticity diagram. The fourth sub-pixel emits light having a second point on the CIE 1976 (L*, u*, v*) color space chromaticity diagram. In some embodiments, the difference between the first point and the second point has a duv value less than 0.005. Preferably, the difference between the first point and the second point has a duv value less than 0.002. More preferably, the difference between the first point and the second point has a duv value less than 0.001.

In some embodiments, in the first device as described above, the first light source comprises exactly two organic emitting materials: a first organic emitting material and a second organic emitting material. In some embodiments, the first organic emitting material emits blue light that has a first point on the CIE 1931 XYZ color space chromaticity diagram within a first area defined by $CIE_X$=0.100 to 0.200, $CIE_Y$=0.050 to 0.300. In some embodiments, the second organic emitting material emits yellow light that has a second point on CIE 1931 XYZ color space chromaticity diagram within a second area defined by $CIE_X$=0.450 to 0.600, $CIE_Y$=0.400 to 0.550. In some embodiments, the first point and the second point are such that if a line is drawn between the first point and the second point, it passes through a desired white area defined on CIE 1931 XYZ color space chromaticity diagram to be within $CIE_X$=0.315 to 0.350, $CIE_Y$=0.330 to 0.360. The concentration of the first and second organic emitting materials is such that the light produced by the first light source is at a third point on CIE 1931 XYZ color space chromaticity diagram that is within the desired white area. In some embodiments, the first and second organic emitting materials comprise phosphorescent emitters. In some embodiments, the first organic emitting material comprises a fluorescent emitter and the second organic emitting material comprises a phosphorescent emitter. In some embodiments, the first organic emitting material emits light that has a peak wavelength in the visible spectrum between 400 and 500 nm; and the second organic emitting material emits light that has peak wavelength in the visible spectrum between 500 and 700 nm. In some embodiments, the second organic emitting material emits light that has peak wavelength in the visible spectrum between 570 and 600 nm.

In some embodiments, in the first device as described above, the first light source comprises three organic emitting materials: a first organic emitting material, a second organic emitting material, and a third organic emitting material. The first organic emitting material emits blue light that has a first point on CIE 1931 XYZ color space chromaticity diagram within a first area defined by $CIE_X$=0.100 to 0.200, $CIE_Y$=0.050 to 0.300. The second organic emitting material emits green light that has a second point on CIE 1931 XYZ color space chromaticity diagram within a second area defined by $CIE_X$=0.200 to 0.400, $CIE_Y$=0.600 to 0.750. The third organic emitting material emits red light that has a third point on CIE 1931 XYZ color space chromaticity diagram within a third area defined by $CIE_X$=0.600 to 0.720, $CIE_Y$=0.280 to 0.400. In some embodiments, the first, second, and third points are such that a fourth area is defined by a line that is drawn between the first point and the second point, the second point and the third point, and the third point and the first point includes a desired white area defined on CIE 1931 XYZ color space chromaticity diagram to be within $CIE_X$=0.315 to 0.350, $CIE_Y$=0.330 to 0.360. The concentration of the first, second, and third organic emitting materials is such that the light produced by the first light source is at a fourth point on CIE 1931 XYZ color space chromaticity diagram that is within the desired white area. In some embodiments, the first, second, and third organic emitting materials comprise phosphorescent emitters. In some embodiments, the first organic emitting material comprises fluorescent emitters and the second and third organic emitting materials comprise phosphorescent emitters. In some embodiments, the first organic emitting material emits light that has a peak wavelength in the visible spectrum between 400 and 500 nm, the second organic emitting material emits light that has peak wavelength in the visible spectrum between 500 and 570 nm, the third organic emitting material emits light that has peak wavelength in the visible spectrum between 570 and 700 nm.

In some embodiments, in the first device as described above, the fourth sub-pixel emits light that has a first point on CIE 1931 XYZ color space chromaticity diagram within a first area defined by $CIE_X$=0.315 to 0.350, $CIE_Y$=0.330 to 0.360. In some embodiments, in the first device as described above, the first light source comprises a stacked organic light emitting device (SOLED). In some embodiments, the SOLED comprises only phosphorescent emitters. In some embodiments, in the first device as described above, the first light source has a single charge generation layer (CGL).

In some embodiments, in the first device as described above, each of the first, second, third, and fourth sub-pixels has an aperture size. In some embodiments, the aperture size of the fourth sub-pixel is larger than the aperture size of each of the first, second, and third sub-pixels. In some embodiments, the aperture size of the fourth sub-pixel is substantially larger than the aperture size of each of the first, second, and third sub-pixels. In some embodiments, the aperture size of the fourth sub-pixel is between approximately 10% and 300% larger than the aperture size of each of the first, second, and third sub-pixels. In some embodiments, the aperture size of the fourth sub-pixel is smaller than the aperture size of each of the first, second, and third sub-pixels. In some embodiments, the aperture size of the fourth sub-pixel is between approximately 10% and 30% smaller than the aperture size of each of the first, second, and third sub-pixels.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
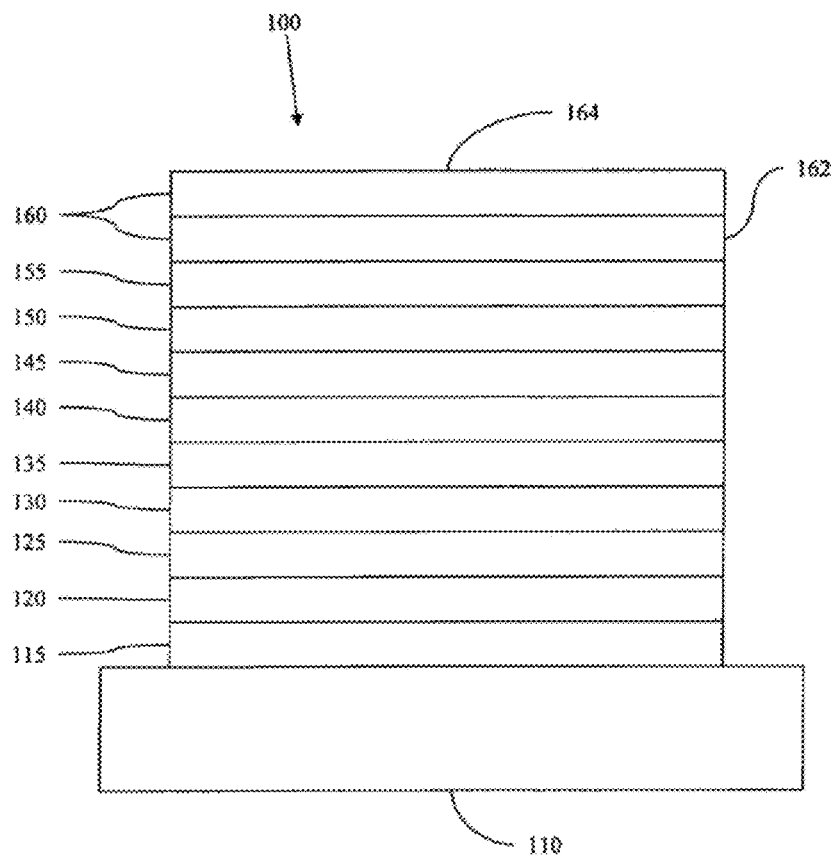
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
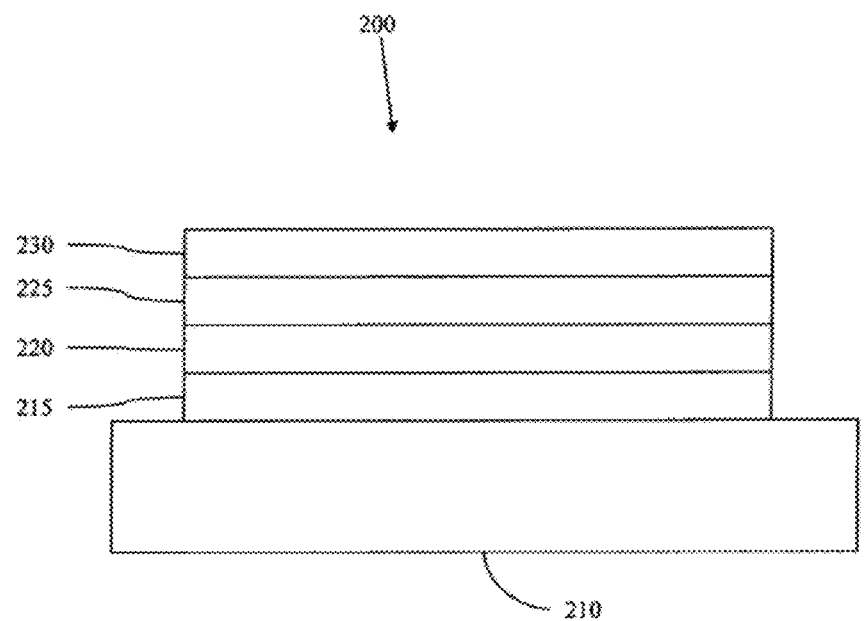
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Figure 3:
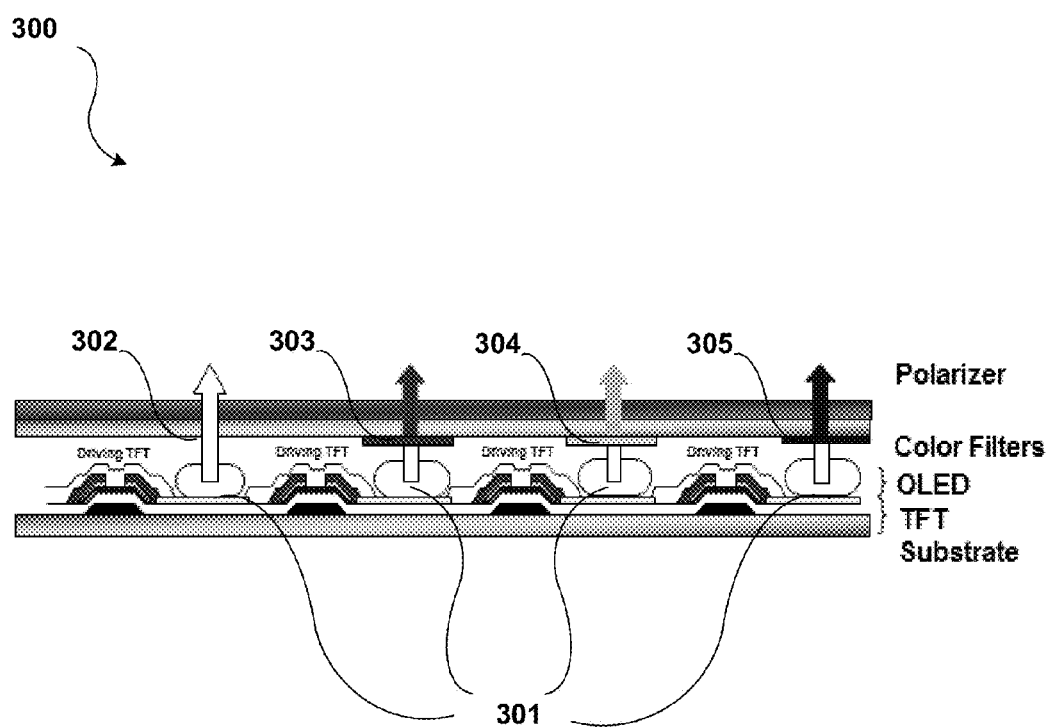
FIG. 3 shows an exemplary embodiment of device in accordance with some embodiments.

Additional definitions for terms as used in this application are provided as follows:

As used herein, a "sub-pixel" may refer to an individually addressable segment or component of a pixel, wherein each segment may emit a different wavelength of visible light that may be combined with other segments within a pixel to provide a desired color in a lighting device (such as a display). A "pixel" is typically the most basic unit of an image displayed on a display (such as computer or television screen), on a printer, or other device. Pixels may be arranged in any manner (for instance, in rows and columns) and a given combination among the pixels of various brightness and color values may form an image. Each sub-pixel may be a component of a pixel used in the representation of a color image. An example of a pixel comprising sub-pixels is shown in FIG. 3, and described below.

As used herein, "emitting" light by or from a sub-pixel (or other components) may comprise having light pass through a sub-pixel of a device, but does not require that the sub-pixel generate the light in any way. For instance, the light that is "emitted" from a sub-pixel may emanate initially from a first light source (that is, for instance, it may comprise the emissions from a white OLED in an RGBW display), and may pass unimpeded through a sub-pixel, through one or more color filters, and/or may pass through any number of other optical components, such as a polarizer.

As used herein, "chromaticity" may refer to an objective specification of the quality of a color regardless of its luminance. That is, as determined by its hue and colorfulness (or saturation, chrominance, intensity, or excitation purity). The chromaticity of light emissions may be measured, for instance using the CIE 1931 XYZ color space or the CIE 1976 (L*, u*, v*) color space.

As used herein, "white balance" may refer to the chromaticity coordinates that serve to define the color "white" in image encoding or reproduction. White balance is also often referred to as the "white balance point" or "white point". The white balance designates the color that is produced, emanated, and/or passed through by a device (or component thereof) to represent the color "white". As is understood by one of ordinary skill in the art, there are many different shades of the color white comprising warmer and cooler colors, and each may comprise a different relative balance of the amount of the input colors (e.g. of red light, blue light, and green light). Thus, the white balance may be a setting that adjusts the relative intensities of the red, green and blue pixels in a display for a given image.

As used herein, "optical communication" may refer to components that are configured in such a way that light that emanates from or passes through a first component also passes through or emanates from the second component. For instance, if light is generated by a light source (such as an OLED device), and the generated light emission then passes through the aperture of a pixel (or a sub-pixel), then the OLED and the pixel (or sub-pixel) may be said to be in optical communication. Optical communication does not require that all of the light that emanates from or passes through the first component also pass through the second component. An example of an OLED that is in optical communication with four sub-pixels is shown in FIG. 3.

As used herein, "D65," may refer to light having a correlated color temperature (CCT) of 6504 K. D65 originally described light having a CCT of 6500 K, but due to a correction of the constants in Planck's law, the CCT was later modified to a slightly higher CCT of 6504 K. The chromaticity coordinates of D65 in CIE 1931 XYZ color space chromaticity diagram are CIE 1931 (x, y)=(0.313, 0.329). This color white light is described in "Explanation of Various Light Sources and Their Use in Visual Color Matching Applications," by GTI Graphic Technology, Inc., which is hereby incorporated by reference in its entirety. In brief, D65 is further described as "light bluish colored light source used in color matching applications of paints, plastics, textiles, raw inks, and other manufactured products. It is the only daylight source that was actually measured. The other daylight sources (D75 and D50) were mathematically derived from these measurements. It accentuates blue and subdues green and red. Commonly used as a primary light source in color measurement instrumentation. It is derived from the average of measurements made of light coming in a north facing window in the northern hemisphere on an overcast day at various times through the day at various times throughout the year."

A s used herein, "D50," may refer to light having a correlated color temperature (CCT) of 5003 K. D50 originally described light having a CCT of 5000 K, but due to a correction of the constants in Planck's law, the CCT was later modified to a slightly higher CCT of 5003 K. The chromaticity coordinates of D50 in CIE 1931 XYZ color space chromaticity diagram are CIE 1931 (x, y)=(0.346, 0.359). This color white light is also described in "Explanation of Various Light Sources and Their Use in Visual Color Matching Applications," by GTI Graphic Technology, Inc. In brief, D50 is further described as "a near white light source used in the evaluation of graphic arts and imaging applications. It has similar amounts of red, green, and blue energy. It neither accentuates nor subdues color, a prime requirement when viewing press sheets and original images (i.e., photographs) since they usually have many colors within the product to be evaluated."

As used herein, "duv" is a general term that may be used to quantify the difference in chromaticity between different lighting devices (such as OLED displays or components of OLED displays). This can quantified in terms of duv=$\sqrt{(\Delta u'^2 + \Delta v'^2)}$, where (u', v') are the coordinates of the different lighting devices in CIE 1976 (L*, u*, v*) color space chromaticity diagram. The CIE 1976 (L*, u*, v*) color space is used in preference over the CIE 1931 XYZ color space because in the CIE 1976 (L*, u*, v*) color space chromaticity diagram, distance is approximately proportional to perceived difference in color. An alternative name for the CIE 1976 (L*, u*, v*) color space chromaticity diagram is the CIE 1976 UCS (uniform chromaticity scale) diagram. The conversion between coordinates in these color spaces is very simple: u'=4x/(−2x+12y+3) and v'=9y/(−2x+12y+3), where (x, y) are the coordinates of the CIE 1931 XYZ color space chromaticity diagram.

The term "Duv" is a specific example of "duv." In this regard, Duv refers to the minimum distance in the CIE 1976 (L*, u*, v*) color space chromaticity diagram of the lighting device chromaticity from the blackbody curve. That is, Duv is a measure of the difference in chromaticity between a lighting device and a blackbody radiator of equivalent correlated color temperature. This can be quantified in terms of Duv=$\sqrt{(\Delta u'^2 + \Delta v'^2)} = \sqrt{((u1'-u2')^2 + (v1'-v2')^2)}$, where (u1', v1') are the coordinates of the lighting device, and (u2', v2') are the coordinates of the blackbody curve at the minimum distance from the lighting device in the CIE 1976 (L*, u*, v*) color space chromaticity diagram.

Embodiments provide a device design (such as for a display) that may have extended lifetime and/or reduced power consumption. The device may use an RGBW layout, where each pixel in the device is divided into four sub-pixels. A white OLED may be used to provide the light emissions for each of the four sub-pixels, and color filters may be used for some or all of the sub-pixels. For instance, a red color filter may be coupled to one of the sub-pixels (R), a green color filter may be coupled to one of the sub-pixels (G), and a blue color filter may be coupled to another one of the sub-pixels (B). In some embodiments, the fourth sub-pixel does not use a color filter, and so emits white light (W). However, embodiments are not so limited and may include a color filter or other chromatic components. Embodiments may further provide that the white balance of the device (e.g. a display) is set to a warmer white than has previously been used or considered.

Examples of exemplary RGBW devices, as well as detailed discussions of their implementations and benefits are described in the following illustrative references, which are hereby incorporated by reference in their entireties:

J. P. Spindler, T. K. Hatwar, M. E. Miller, A. D. Arnold, M. J. Murdoch, P. J. Kane, J. E. Ludwicki, P. J. Alessi, & S. A. Van Slyke, "System Considerations for RGBW OLED Displays;" *Journal of the Society for Information Display*, Vol. 14.1; p. 37 (2006).

J. P. Spindler, T. K. Hatwar, M. E. Miller, A. D. Arnold, M. J. Murdoch, P. J. Kane, J. E. Ludwicki, & S. A. Van Slyke, "Lifetime- and Power-Enhanced RGBW Displays Based on White OLEDs;" Journal of the Society for Information Display; p. 36 (2005).

S. A. Van Slyke, "Advanced Active Matrix OLED Technologies," Display and Components OLED Modules Business Unit, Eastman Kodak Company Rochester, N.Y., USA, Intertech (2004).

Hack et al. "High Efficiency Phosphorescent AMOLEDs: The Path to Long Lifetime TVs," Journal of the Society for Information Display, Vol. 42.1 (May 15, 2011).

U.S. Pat. Pub. No. 2006/0105198 to Spindler et al. entitled "Selecting white point for OLED devices."

U.S. Pat. Pub. No. 2010/0013748 to Cok et al. entitled "Converting Three-Component to Four Component Image."

It should be understood that the references listed above are merely illustrative and are by no means intended to be limiting. Moreover, it should be noted that none of these references, inter alia, identify, suggest, or even address utilizing a light source that emits warmer white light (e.g. having a CCT below 6504 K) for use in an RGBW device and/or setting the white balance of such an exemplary device to a wanner white. As described below, the inventors have recognized and developed exemplary devices that may have increased lifetime and performance utilizing a warmer white source and/or warmer white balance in such devices.

In some embodiments, the emission from the white sub-pixel closely matches the white balance of the device. As noted above, embodiments provide that the white balance of the device may be set to a warmer white, such as D50 (which is a standard illuminant with CCT 5003 K). In this regard, embodiments generally provide that the white balance of the device may be set to a white that has a CCT that is less than D65 (which has a CCT equal to 6504 K). The inventors have found that it is preferred to use warmer whites rather than the previously used cooler whites (such as D65 or even cooler whites having a CCT greater than 6504 K (e.g. D90, which has CCT approximately equal to 9000 K)) because less blue emission is required for generating the warmer whites. As the blue emission is often the limiting component of a white OLED, using less blue emission may thereby extend the lifetime of the W sub-pixel, which is often the critical sub-pixel that determines lifetime for an RGBW display. That is, the white sub-pixel is often the first sub-pixel for which the degradation of the device (e.g. based on the use of the device and factors such as the operating temperature, operating power, etc.) affects the performance of the device to the point at which its performance is no longer ideal or acceptable for its intended purpose. In this manner, the inventors have recognized some of the benefits provided by optimizing the white balance of the device so as to, for instance, provide for increased lifetime over similar deices using a cooler white balance.

In addition to utilizing a warmer white balance to improve lifetime of a device, the inventors have recognized that it may be preferred in some embodiments that the RGBW display uses a white OLED organic layer design that comprises at least two organic stacks. As described below with reference to FIG. 6, the use of multiple stacks reduces power consumption in such devices that utilize thin film transistors (TFT) because, in some embodiments, the OLED stacks comprise a TFT voltage offset. Thus, typically the more organic stacks such a device comprises, the more efficient the device operates. However, the introduction of additional stacks to the OLED may add costs to the device in other ways, such as by increasing the fabrication cost associated with depositing the additional layers.

The inventors have also recognized in some embodiments that it may be preferred that the W sub-pixel be enlarged (e.g. the aperture of the sub-pixel that emits white light) so as to reduce the current density of the OLED required to provide the same light output. That is, by enlarging the area of the sub-pixel that emits white light, less luminance per unit area is required to obtain the same overall light emission value, and therefore less current is required to be supplied to the OLED. Indeed, in many displays, white light comprises the majority of light emissions from display and thereby it may be preferred that this sub-pixel has the largest emission aperture area.

The inventors have also recognized that in some embodiments it may be preferred to reduce the size of the W sub-pixel. In some embodiments, this may lead to improved resolution and larger display color gamut. However, reducing the size of the W sub-pixel may have a negative impact on a lighting device because it may require an increase in the luminance per unit area of the sub-pixel. This may in turn require higher current densities and thereby reduce the lifetime of the device.

The inventors have also recognized other methods and designs that may provide for a more efficient and/or longer lasting device. For instance, in some embodiments it may be preferred that the RGBW display use phosphorescent emitters for the organic light source so as to reduce the drive current of the OLED. Reducing the drive current may reduce the operating temperature of the white OLED and therefore extend the lifetime of the device (note that increased temperature causes organic devices to degrade faster). In this regard, it may be preferred that all emitters are phosphorescent. However, a device design comprising, for example, phosphorescent red and green components and a fluorescent blue component may also be suitable.

FIG. 3 illustrates an exemplary RGBW display architecture. As shown, the exemplary device 300 comprises a pixel having a single OLED 301 that preferably emits white light. The pixel of the device 300 also comprises four sub-pixels, where each of the sub-pixels 302-305 is shown as being in optical communication with the single OLED 301. That is, light emitted from the OLED 301 may pass through, and be emitted by, each of the sub-pixels 302-305. As shown, the four sub-pixels comprise: a white ("W") sub-pixel 302 illustrated as having no color filter; a red ("R") sub-pixel 303 that comprises a red color filter; a blue ("B") sub-pixel 304 that comprises a blue color filter; and a green ("G") sub-pixel 305 that comprises a green color filter. That is, the color filter for sub-pixel 303 is configured so as to only permit light that has a peak wavelength in the range of 570-700 nm to pass through; the color filter for sub-pixel 304 is configured so as to only permit light that has a peak wavelength in the range of 400-500 nm to pass through; and the color filter for sub-pixel 305 is configured so as to only permit light that has a peak wavelength in the range of 500-570 nm to pass through. The W sub-pixel 302 is depicted as not comprising a color filter such that the light from the OLED 301 may be emitted by the sub-pixel without any filtering based on color (i.e. based on the wave length of the light emissions). However, this need not be the case and some embodiments could comprise a color filter for the white sub-pixel 302.

The light emission from each of the sub-pixels 302-305 is controlled by a plurality of thin film transistors (TFT), each of which determines the amount of light emissions from each the of the sub-pixels at any given time. However, any suitable manner of controlling the light emissions from each of the sub-pixels may be used. In addition, device 300 may have any additional layers or components coupled to some or all of the sub-pixels, such as a polarizer, outcoupling devices, etc. In this manner, a single white OLED 301 may be used in combination with a plurality of sub-pixels (typically comprising one or more color filters) so as to achieve a wide variety of colors based on the amount of blue, green, red, and white light emitted from each of the corresponding sub-pixels. It should be noted that although sub-pixels 302-305 are pictured in FIG. 3 as comprising a line, embodiments are not so limited and may comprise any arrangement of the sub-pixels (and pixels), such as in a square, in a row or column, or in any other suitable arrangement. In addition, although FIG. 3 depicts each sub-pixel as comprising the same aperture size, embodiments are not so limited and may include sub-pixels of all different shapes and sizes. This may allow for the device to be designed for a particular purpose, or, as noted above, may be designed to optimize the device, such as by providing a W sub-pixel with a larger aperture size than the other sub-pixels.

Exemplary Embodiments

Described below are exemplary embodiments of devices comprising red, green, blue, and white (RGBW) device designs (such as OLED displays) that may provide extended lifetime and/or reduced power consumption by utilizing a warmer white balance and/or a warmer white emission for the device. The embodiments described below are for illustration purposes only and are not thereby intended to be limiting. After reading this disclosure, it may be apparent to a person of ordinary skill that various components as described below may be combined or omitted in certain embodiments, while still practicing the principles described.

A first device is provided that includes a first light source that has at least one organic light emitting device. Preferably, the light source emits white light such that the light emissions may be passed through one or more color filters to obtain a variety of different colors. In some embodiments, for instance, the first light source may comprise a white OLED having at least two emitters (such as emissive materials that emit yellow light and blue light), but could comprise any number of materials (such as emissive materials that emit red, green, and blue light). Such embodiments may provide the advantage of using a common emitting layer or layers (i.e. there may be no need for deposition of the organic materials through a fine metal mask), requiring fewer OLED processing steps, and/or utilizing a device that has reduced differential aging (as white OLEDs tend to be very stable). However, embodiments are not so limited, and may comprise a first light source having multiple colored lighting devices (i.e. multiple color emitting OLEDs) or, for instance, multiple individually patterned white OLEDs.

The first light source may emit light having a correlated color temperature (CCT) that is less than 6504 K (which corresponds to D65 white light). By emitting a warmer color white, the first light source need not have as high a level of blue emissions relative to cooler white light emissions. As the blue emitting material is often the limiting material of an organic light emitting device, the inventors have found that optimizing the white emissions (i.e. choosing a warmer color white light) may increase device lifetime and efficiency. In addition, embodiments may utilize a warmer white balance (which, as described below, in some embodiments is designed to correspond to the white light emissions from the first light source and/or the fourth sub-pixel) and thereby increase the lifetime of a device by requiring less blue light emissions (e.g. when displaying images on a display). As defined above, the white balance is the setting of the first device (such as a display) that determines the color of the white light for the device. A large portion of typical image content contains a significant white component, which can be quantified in terms of excitation purity. Therefore, choosing a white balance that utilizes less blue light also reduces the amount of blue emissions required for the device to operate. The inventors have thereby further discovered that optimizing the choice of the white balance (i.e. choosing warmer white balances and/or the white emission of the lighting device to coordinate with the warmer white balance) may significantly increase the lifetime and/or efficiency of the lighting device (such as an RGBW display as illustrated in the exemplary embodiment in FIG. 3, described above).

The first device may also comprise a plurality of pixels. Each of the pixels may comprise a first sub-pixel comprising a first color filter in optical communication with the first light source. The first color filter may be adapted to pass light from the first light source having a peak wavelength in the visible spectrum between 400 and 500 nm. That is, the first sub-pixel may comprise a blue color filter, and may be configured such that light emitted from the first light source may pass through the sub-pixel. This is illustrated in FIG. 3. As the light passes through the sub-pixel, it passes through the color filter, where only light of the desired wavelength may pass. In this manner, the first sub-pixel may emit blue light utilizing light emitted from a white (or near white) light source.

Each of the pixels of the first device may also comprise a second sub-pixel having a second color filter in optical communication with the first light source. The second color filter may be adapted to pass light from the first light source that has a peak wavelength in the visible spectrum between 500 and 580 nm. Similar to the first sub-pixel, the second sub-pixel may comprise a green color filter, and may be configured such that light emitted from the first light source may pass through the sub-pixel. This again is illustrated in FIG. 3. As the light passes through the sub-pixel, it passes through the color filter, where only light of the desired wavelength may pass. In this manner, the second sub-pixel may emit green light utilizing light emitted from a white (or near white) light source.

Each of the pixels of the first device may also comprise a third sub-pixel having a third color filter in optical communication with the first light source. The third color filter may be adapted to pass light from the first light source having a peak wavelength in the visible spectrum between 580 and 700 nm. Similar to the first and second sub-pixels, the third sub-pixel may comprise a red color filter, and may be configured such that light emitted from the first light source may pass through the sub-pixel. This again is illustrated in FIG. 3. As the light passes through the sub-pixel, it passes through the color filter, where only light of the desired wavelength may pass. In this manner, the third sub-pixel may emit red light utilizing light emitted from a white (or near white) light source.

Each of the pixels of the first device may also comprise a fourth sub-pixel that emits near white light. The near white light may have a CCT that is less than 6504 K. Unlike the first, second, and third sub-pixels, the fourth sub-pixel need not (but may) comprise a color filter. Indeed, in some embodiments, the light emitted from the first light source may pass through and be emitted by the fourth sub-pixel without any color filtering. That is, for instance, the emission from the fourth sub-pixel may comprise white light that corresponds to the white light emitted from the first light source. In this manner, if the first light source has a CCT that is less than 6504 K (i.e. a warmer white light then previously considered for RGBW displays), the fourth sub-pixel may also thereby emit the warmer color white light. As described below, in some embodiments, the white emission (i.e. the white light emitted from the fourth sub-pixel) may closely correspond to the white balance setting of the first device.

As noted above, in some embodiments, in the first device as described above having a first light source and first, second, third, and fourth sub-pixels, the fourth sub-pixel does not comprise a color filter such that white light emitted from the first device may pass through the fourth sub-pixels relatively unimpeded by absorption from such a filter (thereby operating more efficiently). In some embodiments, the chromaticity of the first light source is substantially the same as the chromaticity of the light emitted by the fourth sub-pixel, where chromaticity was defined above. That is, as alluded to previously, the light that is emitted from the fourth sub-pixel may comprise the same (or substantially the same) white light that is emitted from the first light source (this may again result in a more efficient device as there are less losses associated with the emission of white light from the fourth sub-pixel). In some embodiments, in the first device as described above, the fourth sub-pixel emits light that has a first point on the CIE 1931 (x, y) chromaticity diagram within a first area defined by $CIE_x$=0.315 to 0.350, $CIE_y$=0.330 to 0.360. The area defined by these coordinates in the CIE 1931 XYZ color space correspond to warmer white light (i.e. having a CCT below 6504 K). In such embodiments, where the fourth sub-pixel may provide the white emission of the display, the device may operate at higher efficiency and have a longer lifetime based in part on the decrease in the need for blue emissions by setting the white light emissions from the fourth sub-pixel as a warmer white light. However, as indicated by the range provided for the area for the 1931 CIE XYZ color space, the fourth sub-pixel need not emit light that has CIE coordinates located precisely on the Planckian locus.

In this regard, in some embodiments, in the first device as described above having a first light source and first, second, third, and fourth sub-pixels, the fourth sub-pixel emits light that has a first point on the CIE 1976 (L*, u*, v*) color space chromaticity diagram that lies within a Duv distance of 0.010 from the Planckian locus, where Duv may be defined as above. Preferably, the fourth sub-pixel emits light that has a first point on the CIE 1976 (L*, u*, v*) color space chromaticity diagram that lies within a Duv distance of 0.005 from the Planckian locus. More preferably, the fourth sub-pixel emits light that has a first point on the CIE 1976 (L*, u*, v*) color space chromaticity diagram that lies within a Duv distance of 0.002 from the Planckian locus. That is, it is preferred that the fourth sub-pixel emit light that is as close to the Planckian locus as possible. For instance, the farther away from the Planckian locus the chromaticity of the white light emissions from the fourth sub-pixel is located, the less a color will appear like an incandescent blackbody. This may cause the white light from the fourth sub-pixel to appear to contain excess traces of some or all of the colors red, green, or blue (for example, the light may appear "bluish," "reddish," "greenish") and/or some combination of some or all of these colors depending on the direction the point lies away from the Planckian locus. Also, in part because white light is a component of many of the color images of a display (that is, light from the fourth sub-pixel is often provided even when displaying a color), if the white light emitted from the fourth sub-pixel has chromaticity too far a distance from the Planckian locus, it may result in creating a noticeable color hue in the color images displayed. Therefore, it is desirable that the light emitted by the fourth sub-pixel correspond closely to the back body curve.

In some embodiments, in the first device as described above having a first light source and first, second, third, and fourth sub-pixels, the fourth sub-pixel emits light that has a CCT that is greater than 4000 K and less than 6504 K. That is, as noted above, the inventors have determined that utilizing a warmer white light (i.e. having a CCT less than 6504 K) in a device (such as an RGBW display) can increase efficiency and lifetime of the device. However, if the white light emission has a CCT value that is too low (i.e. below 4000 K), then the white light may no longer be ideal or suitable for displaying images or performing other desired functions. Therefore, in some embodiments, it is preferred that the white light emitted from the fourth sub-pixel have a CCT value that is greater than 4000 K. In some embodiments, the fourth sub-pixel emits light that has a CCT that is greater than 4000 K and less than 6400 K. Again, as the white light emitted by the fourth sub-pixel (and/or the first light source and/or a setting of the white balance of the device) is configured to correspond to a warmer CCT value, the inventors have found that this may lead to a more efficient device and/or longer lifetimes based in part on the decrease in the required levels of light emittance form the blue emitting material. In some embodiments, the fourth sub-pixel emits light that has a CCT that is greater than 4000 K and less than 5600 K. In some embodiments, the fourth sub-pixel emits light that has a CCT that is greater than 4000 K and less than 5200 K. In some embodiments, the fourth sub-pixel emits light that has a CCT that is greater than 4000 K and less than 4800 K. In some embodiments, the fourth sub-pixel emits light that has a CCT that is greater than 5800 K and less than 6200 K. The inventors have found that for some applications, this range for the CCT of the white emissions from the fourth sub-pixel may comprise a preferable setting for increasing the lifetime and power efficiency while maintaining desired performance of the device. That is, the inventors have found that by utilizing a white emission having a CCT between 5800 K and 6200 K, a device may have some of the benefits of increased efficiency and lifetime without significantly sacrificing some of the functional quality of the first device, such as the rendering and representation of an image when the first device is a display. For instance, in some embodiments, if the white light emitted is too warm (i.e. has CCT much lower that 6504 K), this may effect the quality or color of the images by creating a yellow or red tone. Therefore, in some embodiments, the range of white emissions having a CCT between 5800 K and 6200 K may be preferred. In particular, consumers are well-acquainted with displays that have white balance around D65 (CCT of 6504 K). Consumers are also well-acquainted with displays that have substantially cooler white balance around D90 (CCT of approximately 9000 K). These white balances are generally more suited to lighting technology other than those that utilize OLEDs, such as inorganic LEDs and fluorescent tubes, which are more efficient when operating at cooler white (i.e. a higher CCT value). These cool white balances tend to accentuate blue and provide artificial vividness to the colors of the displayed image. Consumers are now accustomed to displays with these properties, and there may be reluctance to any extreme changes in the appearance of displayed images.

In some embodiments, in the first device as described above having a first light source and first, second, third, and fourth sub-pixels, the first device is a display. The first device further comprises a white balance having chromaticity that is approximately equal to the chromaticity of the light emitted from the fourth sub-pixel. In some embodiments, setting the white balance of the display to approximately equal the chromaticity of the light emitted from the fourth sub-pixel may provide increased efficiency based in part on the fact that the device may render the color white utilizing only the light emitted by the first light source (e.g. a white OLED) that is directly emitted from the fourth sub-pixel (e.g. the white light is not color filtered) and may, but need not comprise light from the other sub-pixels. Moreover, as described above, the white balance also determines the characteristics of the light emissions for rendering other colors by the display because white light comprises a substantial portion of most of the images. Thus, by setting the white balance approximately equal to the chromaticity of the white light emitted form the first light source, the first device may optimize power efficiency of the first device because less light may need to be passed through color filters (where absorption losses occur) to render different color images.

In some embodiments, in the first device as described above having a first light source and first, second, third, and fourth sub-pixels, where the first device is a display having a white balance, the white balance has a first point on the CIE 1976 (L*, u*, v*) color space chromaticity diagram. That is, the white balance may be represented by a color having CIE 1976 (u', v') coordinates. Similarly, the fourth sub-pixel emits light having a second point on the CIE 1976 (L*, u*, v*) color space chromaticity diagram. In some embodiments, the difference between the first point and the second point has a duv value (i.e. the measure of the difference between the two points on the CIE 1976 (L*, u*, v*) color space chromaticity diagram, as described above) of less than 0.005. Preferably, the difference between the first point and the second point has a duv value less than 0.002. More preferably, the difference between the first point and the second point has a duv value less than 0.001. As noted above, it is preferred in some embodiments that the chromaticity of the light emitted from the first light source approximately equals the chromaticity of the light emitted by the fourth sub-pixel. The use of duv as a unit of measure of the difference between these two values is a method of quantifying the difference using CIE 1976 (L*, u* v*) color space chromaticity diagram. The smaller the value of duv between the two points in the CIE 1976 (L*, u*, v*) color space chromaticity diagram, the less noticeable the difference may appear to a viewer. If the difference between the points representing the chromaticity of the fourth sub-pixel and the white balance has a value much greater than duv of 0.005, then the first device may require a correction to be made, for instance in the form of adding additional light emissions from one or more of the other sub-pixels to the light emitted by the fourth sub-pixel so that the color white of the display corresponds to the white balance setting (other corrections may also be used, such as adding a color filter to the fourth sub-pixel). Many of these corrections may decrease the efficiency of the device (for instance, the use of color filters increases losses due to the absorption of light by the filter). It may therefore be preferred that the chromaticity of the fourth sub-pixel (and the first light source) correspond as closely as possible to the white balance of the display, with a relatively low duv value between the points in a CIE 1976 (L*, u*, v*) color space chromaticity diagram.

In some embodiments, in the first device as described above having a first light source and first, second, third, and fourth sub-pixels, the first light source comprises exactly two organic emitting materials: a first organic emitting material and a second organic emitting material. In some embodiments, the first organic emitting material emits blue light that has a first point on the CIE 1931 (x, y) chromaticity diagram within a first area defined by $CIE_X$=0.100 to 0.200, $CIE_Y$=0.050 to 0.300. In some embodiments, the second organic emitting material emits yellow light that has a second point on the CIE 1931 (x, y) chromaticity diagram within a second area defined by $CIE_X$=0.450 to 0.600, $CIE_Y$=0.400 to 0.550. In some embodiments, the first point and the second point are such that if a line is drawn between the first point and the second point, it passes through a desired white area defined on the CIE 1931 (x, y) chromaticity diagram to be within $CIE_X$=0.315 to 0.350, $CIE_Y$=0.330 to 0.360. This desired white area defined by these CIE 1931 (x, y) coordinates corresponds to white light having a CCT value that is warmer than 6504 K because, as noted above, the inventors have found that utilizing the warmer values for the white light emitted by the first device requires less blue emittance, which can thereby increase the lifetime of the first device. In addition, the concentration of the first and second organic emitting materials is such that the light produced by the first light source is at a third point on a chromaticity diagram that is within the desired white area.

Figure 7:
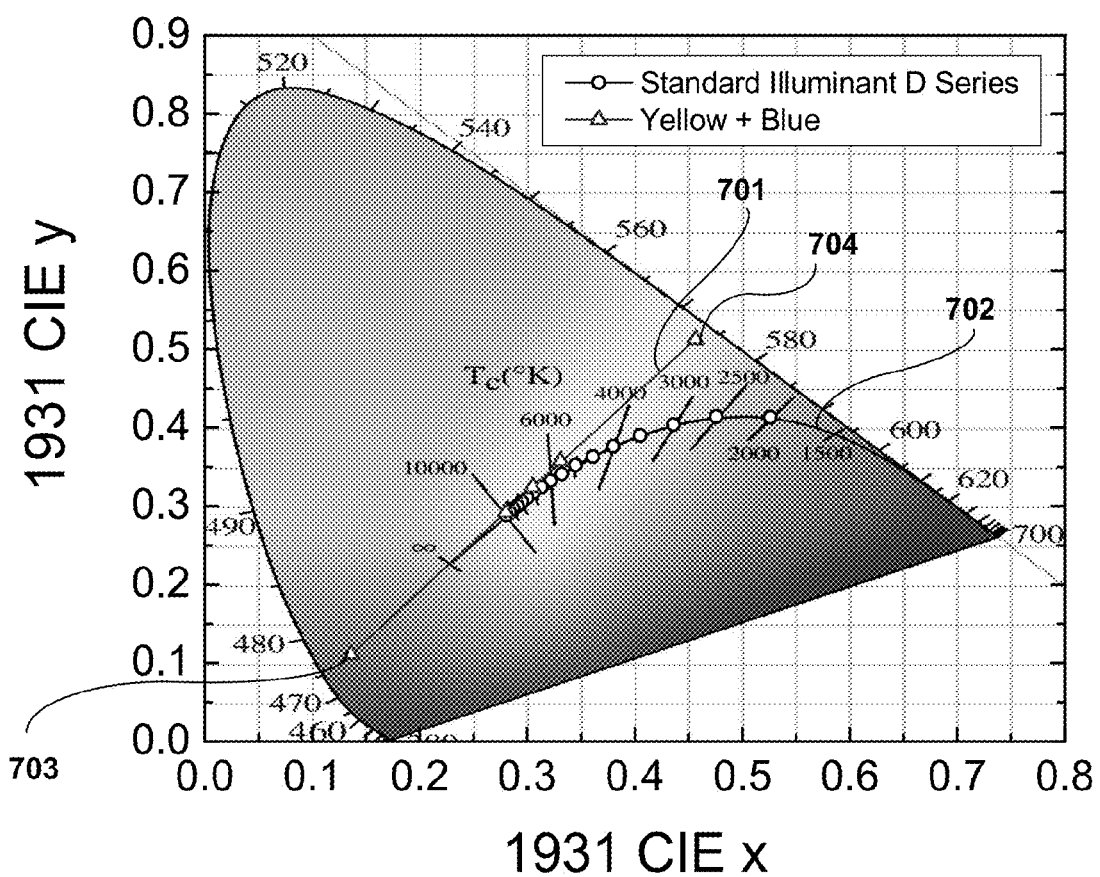
FIG. 7 shows exemplary emissions of a light source on a graph of the 1931 CIE XYZ color space chromaticity diagram in accordance with some embodiments.

An illustration of such an embodiment is shown in FIG. 7, whereby the line 701 is drawn between a first point 703 corresponding the blue light emissions (which is located within an area designated by $CIE_X$=0.100 to 0.200, $CIE_Y$=0.050 to 0.300) and a second point 704 corresponding to the yellow light emissions (which is located within an area designated by $CIE_X$=0.450 to 0.600, $CIE_Y$=0.400 to 0.550). The concentration of each of the blue and yellow emitting materials may be adjusted so as to move along the line 701 (i.e. the more blue emission in comparison to yellow emission, the combined light emission will be closer to the point 703 and vice versa). In this way, the desired white emission of the first light source may be chosen and implemented for the first device.

In some embodiments, the first and second organic emitting materials comprise phosphorescent emitters. As noted above, the use of phosphorescent materials may provide decreased operating temperatures and thereby increase the lifetime of the first device. In some embodiments, the first organic emitting material comprises a fluorescent emitter and the second organic emitting material comprises a phosphorescent emitter. This may be preferred because the lifetime for phosphorescent blue materials are at present not as long as for fluorescent blue materials, and thereby a greater lifetime benefit may be received by using a fluorescent material system for blue. In some embodiments, the first organic emitting material emits light that has a peak wavelength in the visible spectrum between 400 and 500 nm (corresponding to light in the blue spectrum); and the second organic emitting material emits light that has peak wavelength in the visible spectrum between 500 and 700 nm. In some embodiments, the second organic emitting material emits light that has peak wavelength in the visible spectrum between 570 and 600 nm (corresponding to light in the yellow spectrum). As noted above, the blue and yellow emitters may be chosen such that a line that connects between two points on the CIE 1931 (x, y) chromaticity diagram passes through a desired white point. The right concentration of the two materials is then chosen so as to provide a first light source with a combined emission of white light having a desired CIE 1931 (x, y) coordinate.

In some embodiments, in the first device as described above having a first light source and first, second, third, and fourth sub-pixels, the first light source comprises three organic emitting materials: a first organic emitting material, a second organic emitting material, and a third organic emitting material. The first organic emitting material emits blue light that has a first point on the CIE 1931 (x, y) chromaticity diagram within a first area defined by $CIE_X$=0.100 to 0.200, $CIE_Y$=0.050 to 0.300. The second organic emitting material emits green light that has a second point on the CIE 1931 (x, y) chromaticity diagram within a second area defined by $CIE_X$=0.200 to 0.400, $CIE_Y$=0.600 to 0.750. The third organic emitting material emits red light that has a third point on the CIE 1931 (x, y) chromaticity diagram within a third area defined by $CIE_X$=0.600 to 0.720, $CIE_Y$=0.280 to 0.400. By utilizing three different emitting materials, it may be possible to achieve a variety of colors, including many colors that are not achievable by having only two emitting materials. In some embodiments, the use of color filters may make the use of only two emitters (as described above in an exemplary embodiment) more economical (i.e. less cost to manufacture) because the different colors emitted by the first device are provided by the combination of the sub-pixels (that is, the first light source, in some embodiments, need only emit white light, which may be achieved by only two emitting materials). However, in some embodiments, the first light source may comprise a plurality of devices (or a plurality of emitting materials in a single device), each of which emits a different color light (i.e. light having different wavelengths), and the light emissions are combined.

Continuing with this exemplary embodiment, the first, second, and third points may be such that a fourth area is defined by a line that is drawn between the first point and the second point, the second point and the third point, and the third point and the first point that includes a desired white area defined on the CIE 1931 (x, y) chromaticity diagram to be within $CIE_X=0.315$ to $0.350$, $CIE_Y=0.330$ to $0.360$. For instance, the desired area may be within a triangle created by lines that connect the emissions from the first, second, and third organic emitting material. Similar to the embodiment discussed above, the desired area may correspond to white light having a CCT value that is lower than 6504 K, because, as noted above, the inventors have found that utilizing the warmer values for the white light emitted by the first device requires less blue emittance, which can thereby increase the lifetime of the first device. The concentration of the first, second, and third organic emitting materials is such that the light produced by the first light source is at a fourth point on the CIE 1931 (x, y) chromaticity diagram that is within the desired white area.

In some embodiments, the first, second, and third organic emitting materials comprise phosphorescent emitters. As noted above, the inventors have recognized that increased lifetime may be achieved for the first device through the use of one or more phosphorescent emitters for the first light source so as to reduce the operational temperatures of the devices. In some embodiments, the first organic emitting material comprises fluorescent emitters and the second and third organic emitting materials comprise phosphorescent emitters. This may be preferred because the lifetime for phosphorescent blue materials are at present not as long as for fluorescent blue materials, and thereby a greater lifetime benefit may be received by using a fluorescent material system for blue. In some embodiments, the first organic emitting material emits light that has a peak wavelength in the visible spectrum between 400 and 500 nm (corresponding to blue light), the second organic emitting material emits light that has peak wavelength in the visible spectrum between 500 and 570 nm (corresponding to green light), the third organic emitting material emits light that has peak wavelength in the visible spectrum between 570 and 700 nm (corresponding to red light).

In some embodiments, in the first device as described above, the fourth sub-pixel emits light that has a first point on the CIE 1931 (x, y) chromaticity diagram within a first area defined by $CIE_X=0.315$ to $0.350$, $CIE_Y=0.330$ to $0.360$. As was described with regards to some of the exemplary embodiments above, the area defined by these coordinates in the 1931 CIE XYZ color space may correspond to white light having a CCT less than 6504 K. In this regard, the first device lifetime (based on the lifetime of the fourth sub-pixel, which corresponds to the limiting step in the degradation of the first light source) may be improved due in part to the decrease in the level of blue emittance (as the blue emittance material is often the limiting factor). In some embodiments, in the first device as described above, the first light source comprises a stacked organic light emitting device (SOLED). In some embodiments, the SOLED comprises only phosphorescent emitters, which may operated at lower temperatures and/or higher efficiencies. In some embodiments, in the first device as described above, the first light source has a single charge generation layer (CGL).

In some embodiments, in the first device as described above, each of the first, second, third, and fourth sub-pixels has an aperture size. The aperture size of the fourth sub-pixel is larger than the aperture size of each of the first, second, and third sub-pixels. That is, it may be preferred that the aperture size (and/or the size of the sub-pixel itself) of the fourth sub-pixel (i.e. the white sub-pixel) be larger than the other sub-pixels because the white light emitted there is used most often as it comprises a component of many image colors. By having a larger aperture size (through which the white light is emitted from the sub-pixel), the device may be operated at lower current density and still achieve the same luminance. This may thereby extend the lifetime of the device. In some embodiments, the aperture size of the fourth sub-pixel is substantially larger than the aperture size of each of the first, second, and third sub-pixels. By substantially larger, it is meant that the opening through which the light is emitted is at least 5% larger. In some embodiments, the aperture size of the fourth sub-pixel is between approximately 10% and 300% larger than the aperture size of each of the first, second, and third sub-pixels. As noted above, the larger the aperture size of the fourth sub-pixel, the better potential for reducing the current density needed for the first light source to achieve a desired luminance.

The inventors have also recognized that in some embodiments it may be preferred to reduce the size of the W sub-pixel. In some embodiments, this may lead to improved resolution and larger display color gamut. In some embodiments, the aperture size of the fourth sub-pixel may be between approximately 1.1× and 3.0× smaller than the aperture size of each of the first, second, and third sub-pixels. However, reducing the size of the W sub-pixel may have a negative impact on a lighting device because it may require an increase in the luminance per unit area of the sub-pixel. This may in turn require higher current densities and thereby reduce the lifetime of the device.

Exemplary Simulation of Exemplary Embodiment

As was described above, embodiments may provide an RGBW lighting device (such as an OLED display) having a warmer white balance. For instance, the white balance of the display may have a correlated color temperature (CCT) of less than approximately 6504 K. In some embodiments, the emission from the white (W) sub-pixel may closely match the white balance of the display so that the device may operate more efficiently. In some embodiments, it is preferred that the OLED comprises at least two organic stacks. In some embodiments, it is preferred that the W sub-pixel has an aperture size that is greater than the aperture size of the red (R), green (G), and blue (B) sub-pixels, and preferably the aperture size of the W sub-pixel is substantially greater as the light emissions from this sub-pixel often comprise the largest portion of light emitted from such a device. In some embodiments, it is preferred that the white emission is achieved using all-phosphorescent emitters to reduce the operating temperature of the OLED and increase lifetime. This may provide for a device having lower power consumption. In some embodiments, it may be preferred to use red and green phosphorescent components with a fluorescent blue component. Provided below are the results of a simulation performed by the inventors illustrating some of the concepts described above.

In some embodiments and as noted above, particularly in an RGBW OLED display, the white ("W") sub-pixel is typically used most frequently, and so it is the lifetime of the W sub-pixel that determines the display lifetime. As disclosed herein, the inventors have demonstrated that the lifetime of the W sub-pixel may be improved if the W sub-pixel emission (e.g. the white emission of the lighting device) is matched to a warmer white balance (e.g. having a CCT value that is less than D65, which has a CCT of 6,504 K) rather than a cooler white balance (e.g. having a white balance with a CCT equal to or greater than D65). This is illustrated in the following simulation performed by the inventors and described in detail below. It should be understood that the device as described, including the selection of particular components, values, settings, etc., are for illustration purposes only and are not meant to be limiting.

For purposes of illustration and simplicity, in this exemplary simulation, temperature effects were neglected. It should be noted that in a more advanced model, the current density within each sub-pixel could be used to approximate the W sub-pixel operating temperature, and an additional lifetime correction factor could be introduced. In this regard, lower power consumption, and particularly lower current density may be advantageous as it typically reduces the W sub-pixel operating temperature, which may in turn increase the lifetime of the sub-pixel. In addition, there may be a number of ways to achieve a reduced operating temperature. One manner (which may be preferred in some embodiments) recognized by the inventors to achieve a reduction in operating temperature effectively is through the use of highly efficient phosphorescent emitters in the OLED.

Figure 4A:
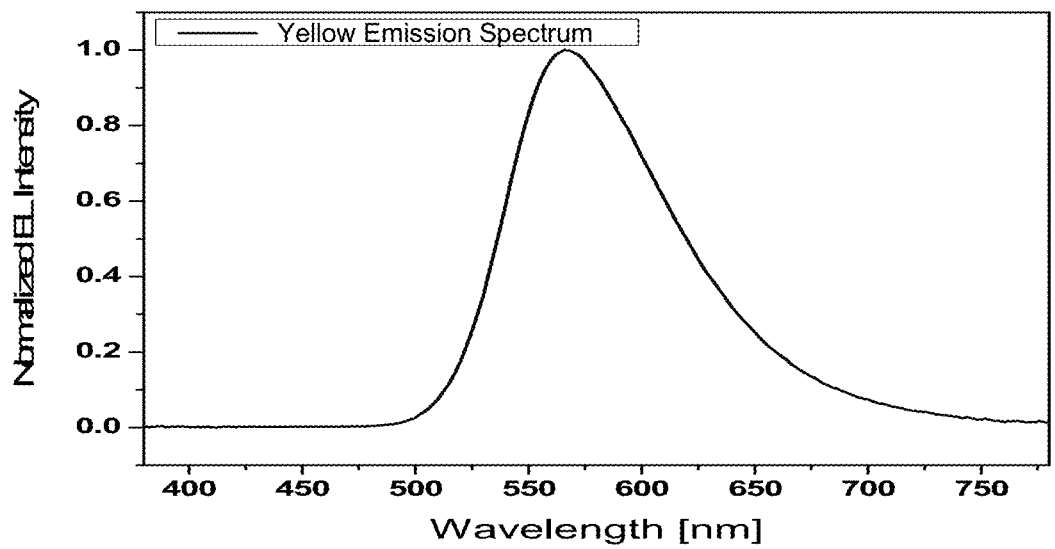
FIGS. 4(a) and (b) are graphs depicting light emissions for an exemplary light source in accordance with some embodiments.
Figure 4B:
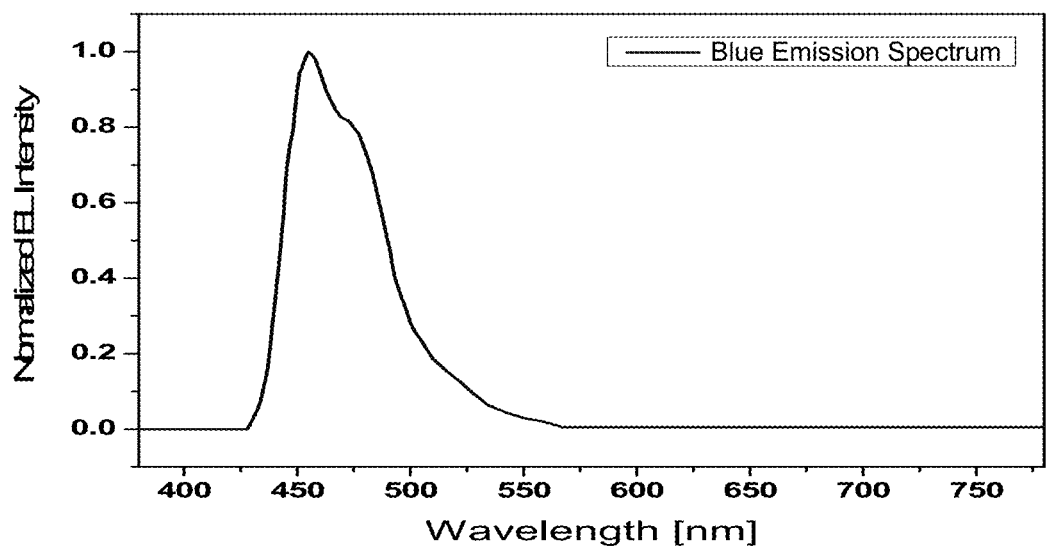

The following W sub-pixel OLED architecture was used for the purposes of this simulation: a two stack OLED device with one internal junction (or charge generation layer (CGL)). The yellow emission is shown in FIG. 4(a), while the blue emission is shown in FIG. 4(b). As can be seen in FIG. 4(a), the yellow emission peaks at 566 nm with full-width at half maximum (FWHM) equal to 84 nm. As shown in FIG. 4(b), the blue emission peaks at 455 nm with FWHM equal to 47 nm. The blue emission spectrum is taken from Kawamura et al., *New Deep Blue Fluorescent Materials and Their Application to High Performance OLEDs*, Proc. Soc. Inf. Disp. Tech. Papers, p. 829 (2011), which is hereby incorporated by reference in its entirety. The external quantum efficiency (EQE) for all resultant sub-pixels (before color filter absorption losses) was assumed to be 40%. This EQE is reasonable if both yellow and blue emission are from phosphorescent material systems.

Figure 5A:
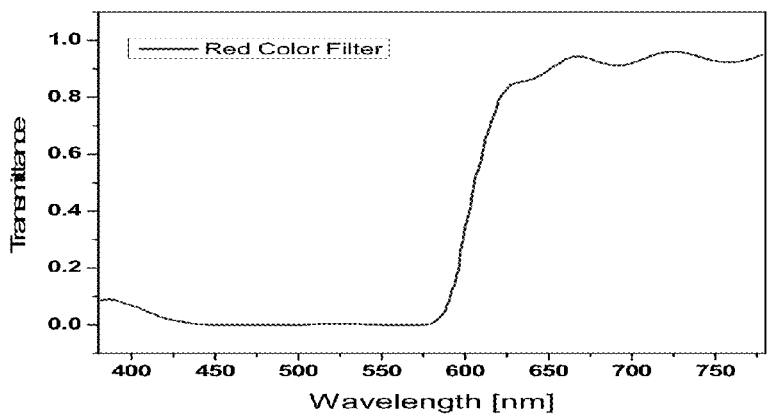
FIGS. 5(a), (b), and (c) show graphs of the transmittance of exemplary color filters in accordance with some embodiments.
Figure 5B:
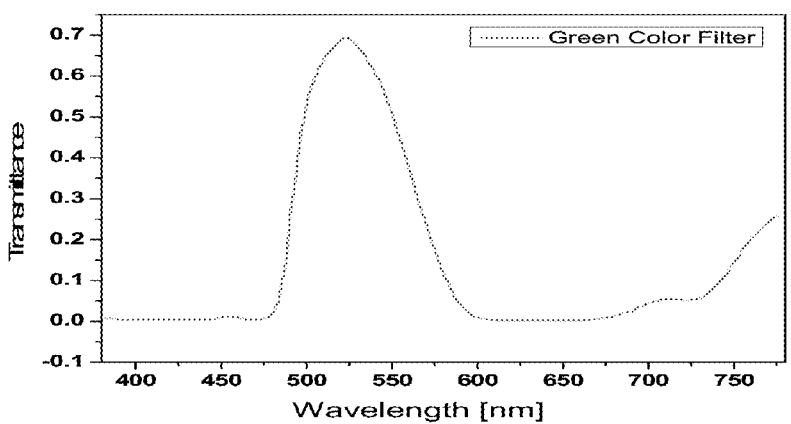
Figure 5C:
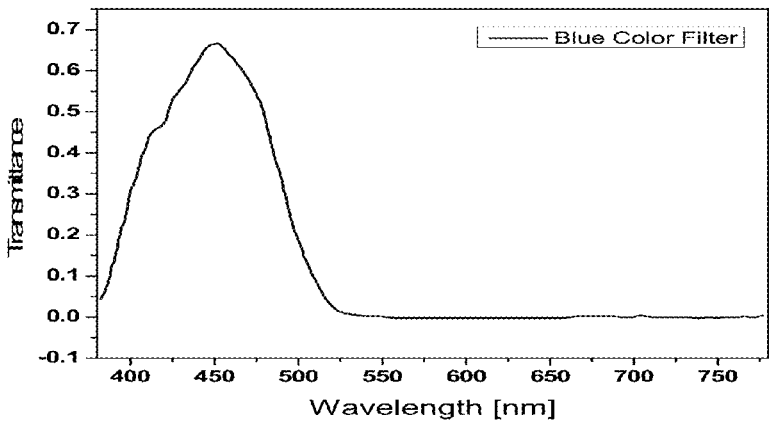

FIGS. 5(a)-(c) show the transmittance of light for the exemplary color filters used for R, G and B sub-pixels in the simulation of the exemplary device. These color filters could correspond to the color filters shown in FIG. 3 for each of the sub-pixels 303-305. FIG. 5(a) shows the transmittance of light as a function of wavelength of the red color filter, which allows light with wavelength above approximately 580 nm to pass through while blocking light having lower wavelengths. FIG. 5(b) shows the transmittance of light as a function of wavelength of the green color filter, which allows light with wavelength between approximately 480 nm and 580 nm to pass through, while blocking light having other wavelengths. FIG. 5(c) shows the transmittance of light as a function of wavelength of the blue color filter, which allows light with wavelength between approximately 390 nm and 520 nm to pass through, while blocking light having other wavelengths. It should be understood that the color filters and properties described herein are exemplary only, and other devices may have color filters with ranges of light transmittance that are slightly different for some or all of the color filters for the sub-pixels.

The voltage of the exemplary display, inclusive of the thin film transistor (TFT) that is used to control the emission from the sub-pixels, was assumed to be 12 V (e.g. 4 V for each OLED stack (two stacks for the exemplary device) and 4 V for the TFT). In general, an OLED device architecture comprising multiple stacks may be preferred because power dissipation from a driving TFT can be reduced. This means that as the number of stacks for the OLED is increased, the percentage power loss from the driving TFT decreases based on the reduction in current at a given brightness. This relationship is shown in FIG. 6.

Figure 6:
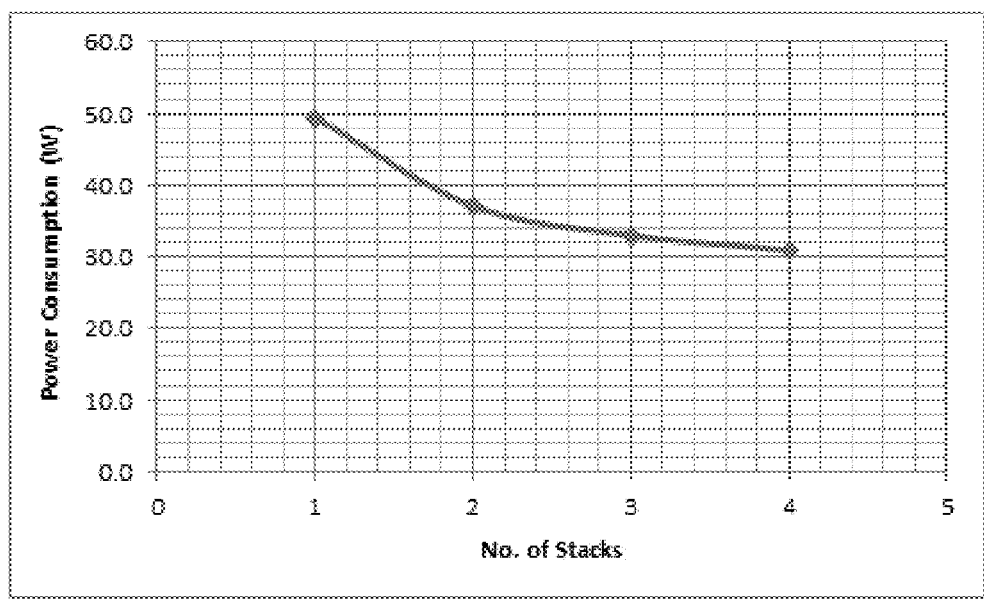
FIG. 6 is a graph of power consumption in relation to the number of stacks of an exemplary light source in accordance with some embodiments.

As illustrated in FIG. 6, the power consumption of the exemplary simulated device has a relatively significant decrease between one and two stack designs. While designs comprising additional stacks (i.e. 3 and 4 stacks) do provide a continued reduction in power consumption, the benefits are generally not as great with the addition of each stack. In particular, FIG. 6 shows data for an exemplary RGBW OLED display with D90 white balance (i.e. having CIE 1931 (x, y) coordinates of (0.287, 0.296) and CCT of approximately 9000 K) and emission from the W sub-pixel closely matched to the white balance, having CIE 1931 (x, y) coordinates of (0.291, 0.291). A power savings of 24.9% can be achieved by moving from a one stack design to a two stack design. Additionally, it is understood that lifetime may also be increased for a given brightness by increasing the number of stacks. This may be due in part to the reduced current density required for the same light output. In this exemplary simulation, the inventors have focused on a two stack design. Although, additional stacks could also be used (which may lower power consumption), the use of the additional stacks may increase fabrication costs and increase light absorption losses.

Continuing with the exemplary simulation, by varying the ratio of yellow to blue emission from the exemplary yellow and blue emitters shown in FIGS. 4(a) and 4(b), respectively, it is possible to demonstrate white emission chromaticity closely matched to the white balance points of D50, D65 and D90. This is shown in FIG. 7 by the line 701. The line 702 represents the Planckian locus (or blackbody locus), which is the path or locus that the color of an incandescent blackbody would take in a particular chromaticity space as the blackbody temperature changes.

Figure 8A:
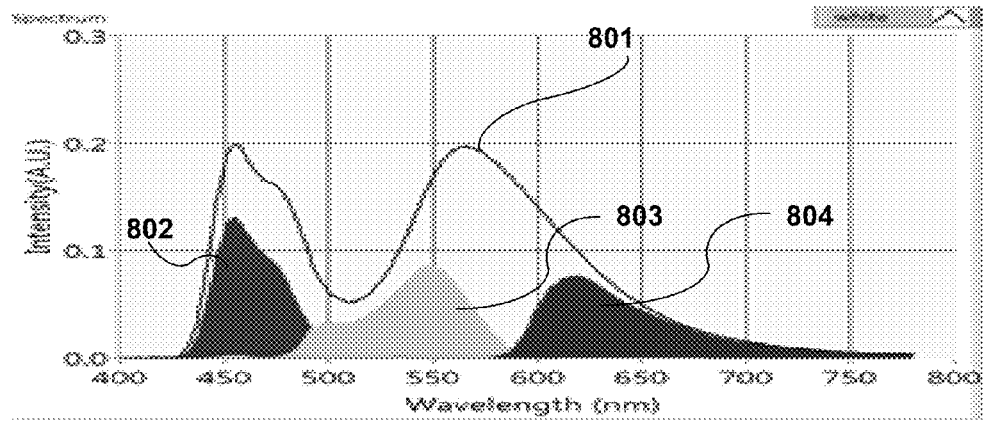
FIGS. 8(a), (b), and (c) show graphs of the light emittance for exemplary color filters and white light emission spectrum in accordance with an exemplary device for a plurality of white balances.
Figure 8B:
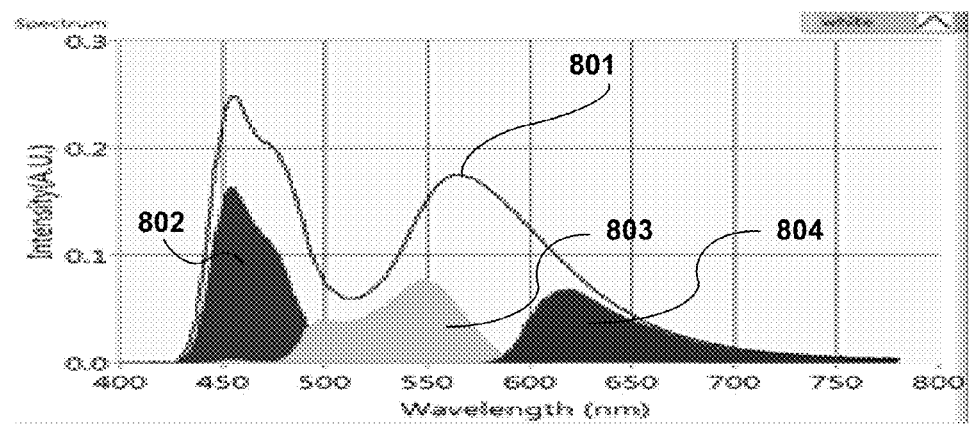
Figure 8C:
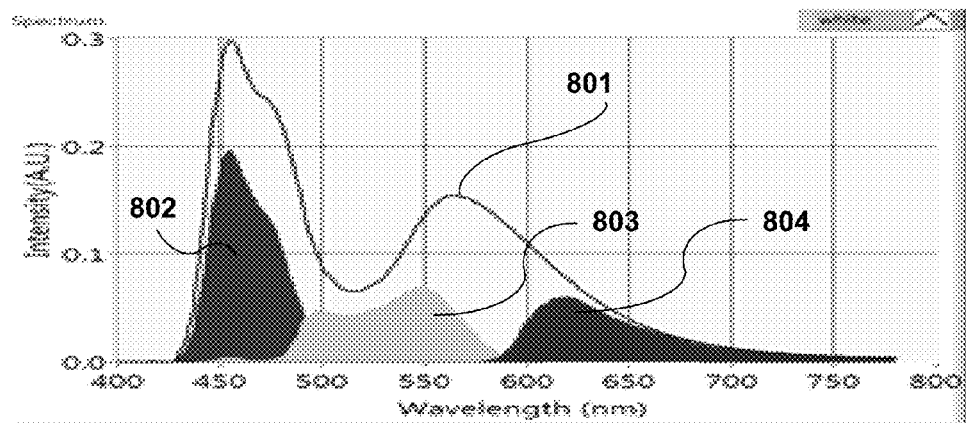

FIGS. 8(a)-(c) show the white emission spectra from the exemplary device. FIG. 8(a) shows the emission spectra for a device having white balance of D50; FIG. 8(b) shows the emission spectra for a device having white balance of D65; and FIG. 8(c) shows the emission spectra for a device having white balance of D90. The black line 801 shows the white emission spectrum of the first light source (which is also the color of the W sub-pixel in the exemplary simulation), while the shaded areas show the transmission that would be expected through each color filter for each white emission spectrum. That is, the shaded areas 802 show the transmission from the blue color filter for each transmission spectrum; the shaded areas 803 show the transmission from the green color filter for each emission spectrum; and the shaded areas 804 shows the transmission from the red color filter for each emission spectrum. It can be seen that considerably less blue emission is required for white emission that corresponds to D50 white balance than for D65 or D90.

For purposes of the exemplary simulation, the power consumption was modeled for an exemplary 32" RGBW OLED display when showing 10 typical sample images. The exemplary display operated at 360 cd/m² at full white (i.e. when all of the display pixels are set to display the color white). Power consumption was modeled for each of the sub-pixels and then total power consumption for the exemplary display was calculated by taking the sum of the power consumption of each sub-pixel. This calculation was performed for each of the 10 sample images, and the average was then used to establish the power consumption of the display. The power consumption of the display was calculated for the three different white balances: (1) D50, having CIE 1931 (x, y) coordinates of approximately (0.346, 0.359); (2) D65, having CIE 1931 (x, y) coordinates of approximately (0.313, 0.329); and (3) D90, having CIE 1931 (x, y) coordinates of approximately (0.287, 0.296). In each case, the white emission of the first light source (and therefore the W sub-pixel) was controlled to closely match the respective white balance: (1) for D50, white emission having CIE 1931 (x, y) coordinates of approximately (0.346, 0.357); (2) for D65, white emission having CIE 1931 (x, y) coordinates of approximately (0.318, 0.324); and (3) for D90 white emission having CIE 1931 (x, y) coordinates of approximately (0.291, 0.292). The white emission color is shown with each white balance in Table 2. The results of this part of the simulation on the exemplary device are shown in Table 1 below:

TABLE 1

Power consumption for different white balance.

| Power | D50 | D65 | D90 |
|---|---|---|---|
| Red [W] | 8.1 | 7.8 | 8.6 |
| Green [W] | 6.8 | 9.2 | 9.3 |
| Blue [W] | 3.7 | 4.6 | 4.9 |
| White [W] | 12.7 | 13.0 | 14.2 |
| Total Power [W] | 31.3 | 34.7 | 37.1 |

As noted above, the lifetime of a typical RGBW OLED display may be determined by the W sub-pixel, or more specifically, by the blue component of the W sub-pixel. Therefore, the inventors have also calculated the average current density in the W sub-pixel for each of the 10 sample images for the exemplary device. This average current density was then used to calculate the expected lifetime of the exemplary display. For this purpose, the lifetime of the blue component to 95% of initial luminance was taken to be LT95=2,000 hrs at 1,000 cd/m$^2$, which is a reasonable lifetime, as reported in Kawamura et al. in Proc. Soc. Inf. Disp. Tech. Papers p829 (2011). An acceleration factor (AF) of 1.5 was assumed. For the exemplary device, the sub-pixel aperture ratio for each sub-pixel was assumed to be 40%. Lifetime of the exemplary display was calculated for the same three different white balances and white emissions: The results of this portion of the simulation are shown below in Table 2:

for D90. The data is further summarized in Table 2 (in the "Power" column). The "B-Factor" shows the ratio of the peak height of the blue emission to the peak height of the highest of the red or the green emission peaks.

Figure 9:
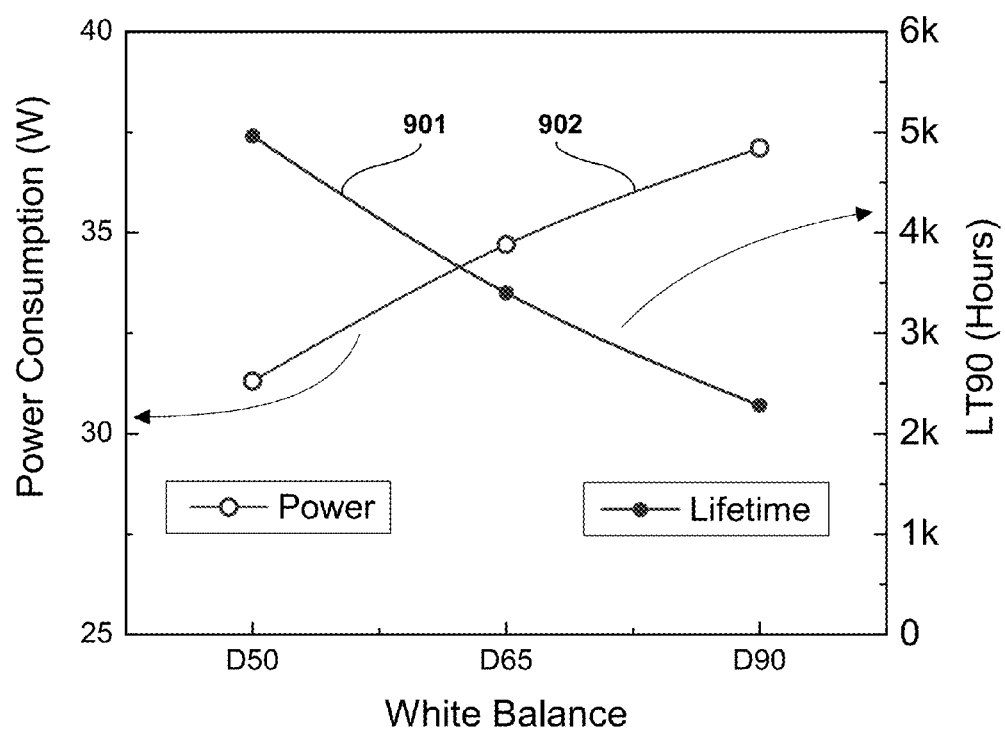
FIG. 9 shows a graph of power consumption and lifetime of a W sub-pixel of an exemplary device in accordance with some embodiments.

It can be seen from Table 2 that, for the exemplary simulation, when moving from a D65 white balance to a D50 white balance, there is a reduction in power consumption of 9.8%, and an increase in the lifetime for the W sub-pixel (here measured to LT90 (i.e. the time in which the sub-pixel is at 90% of initial luminance)) of 47.1%. Power consumption and lifetime data as a function of the white balance are shown in FIG. 9 (note that the lifetime data 901 is measured in hours based on the scale on the right of the graph in FIG. 9; while power consumption data 902 is measured in Watts based on the scale on the left of the graph in FIG. 9). As shown in FIG. 9, the lifetime 901 of the white sub-pixel increases as the power consumption 902 decreases. Moreover, as the white balance is decreased from D90 to D65 to D50, the lifetime 901 of the W sub-pixel increases. Note that, as described above, to minimize power consumption at any white balance level (and correspondingly to achieve the longest lifetime), the white emission of the display should be substantially matched to the selected white balance.

The exemplary simulation shows that by selecting a white balance point that is a warmer white than previously considered (e.g. having a CCT value less than that of D65, which has CCT of 6504 K), and also by closely matching the W sub-pixel emission to this white balance, it is possible to minimize display power consumption and maximize operating lifetime. In addition, further improvement in lifetime can be achieved, for instance, by using a larger W sub-pixel aperture (such that the required current density is decreased) and/or by using multiple OLED stacks. As noted above, the inventors, unlike previous devices, have optimized the white balance point and have not arbitrarily set this to a value of D65.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

A recitation of "a", "an" or "the" is intended to mean "one or more" unless specifically indicated to the contrary.

TABLE 2

Power consumption and lifetime for different white balance.

| | White Balance CIE 1931 (x, y) | B-Factor | White Emission CIE 1931 (x, y) | Power [W] | LT90 [Khrs] | Efficacy [cd/A] | | | |
|---|---|---|---|---|---|---|---|---|---|
| | | | | | | R sub-pixel | G sub-pixel | B sub-pixel | W sub-pixel |
| D50 | (0.346, 0.359) | 1.023 | (0.346, 0.357) | 31.3 | 5.0 | 9.7 | 28.0 | 3.1 | 96.6 |
| D65 | (0.313, 0.329) | 1.438 | (0.318, 0.324) | 34.7 | 3.4 | 8.6 | 26.4 | 3.8 | 90.0 |
| D90 | (0.287, 0.296) | 1.973 | (0.291, 0.292) | 37.1 | 2.3 | 7.6 | 24.7 | 4.5 | 83.4 |

Table 1 shows the power consumption of each sub-pixel for each of the 3 different white balances, as well as the total display power consumption. It can be seen that for the exemplary simulation, the power consumption is lowest for D50. That is, the power consumption in the simulation for D50 was calculated to be 3.4 W less than for D65, and 5.8 W less than

What is claimed is:

1. A first device comprising:
a first light source that comprises at least one organic light emitting device, wherein the first light source emits near white light having a correlated color temperature (CCT) that is less than 6504 K; and:

a plurality of pixels, wherein each pixel comprises:
  a first sub-pixel comprising a first color filter in optical communication with the first light source, wherein the first color filter is adapted to pass light from the first light source, wherein the light passed by the first color filter has a peak wavelength in the visible spectrum between 400 and 500 nm;
  a second sub-pixel comprising a second color filter in optical communication with the first light source, wherein the second color filter is adapted to pass light from the first light source, wherein the light passed by the second color filter has a peak wavelength in the visible spectrum between 500 and 580 nm;
  a third sub-pixel comprising a third color filter in optical communication with the first light source, wherein the third color filter is adapted to pass light from the first light source, wherein the light passed by the third color filter has a peak wavelength in the visible spectrum between 580 and 700 nm; and
  a fourth sub-pixel that emits near white light with correlated color temperature (CCT) that is less than 6504 K,
  wherein each of the pixels includes only the first, second, third and fourth sub-pixels.

2. The first device of claim 1, wherein the fourth sub-pixel does not comprise a color filter.

3. The first device of claim 1, wherein the chromaticity of the first light source is substantially the same as the chromaticity of the light emitted by the fourth sub-pixel.

4. The first device of claim 1, wherein the fourth sub-pixel emits light that has a first point on the CIE 1931 XYZ color space chromaticity diagram within a first area defined by $CIE_X$=0.315 to 0.350, $CIE_Y$=0.330 to 0.360.

5. The first device of claim 1, wherein the fourth sub-pixel emits light that has a first point on the CIE 1976 (L*, u*, v*) color space chromaticity diagram that lies within a Duv distance of 0.010 from the Planckian locus.

6. The first device of claim 1, wherein the fourth sub-pixel emits light that has a correlated color temperature (CCT) that is greater than 4000 K and less than 6504 K.

7. The first device of claim 6, wherein the fourth sub-pixel emits light that has a correlated color temperature that is greater than 4000 K and less than 6400 K.

8. The first device of claim 6, wherein the fourth sub-pixel emits light that has a correlated color temperature that is greater than 5800 K and less than 6200 K.

9. The first device of claim 1, wherein the first device is a display having a white balance, and wherein the chromaticity of the white balance of the display is approximately equal to the chromaticity of the light emitted from the fourth sub-pixel.

10. The first device of claim 1,
  wherein the first device is a display having a white balance;
  wherein the white balance has a first point on the CIE 1976 (L*, u*, v*) color space chromaticity diagram;
  wherein the fourth sub-pixel emits light having a second point on the CIE 1976 (L*, u*, v*) color space chromaticity diagram; and
  wherein the difference between the first point and the second point has a duv value less than 0.005.

11. The first device of claim 1, wherein the first light source comprises exactly two organic emitting materials, a first organic emitting material and a second organic emitting material.

12. The first device of claim 11, wherein the first organic emitting material emits blue light that has a first point on the CIE 1931 XYZ color space chromaticity diagram within a first area defined by $CIE_X$=0.100 to 0.200, $CIE_Y$=0.050 to 0.300;
  wherein the second organic emitting material emits yellow light that has a second point on the CIE 1931 XYZ color space chromaticity diagram within a second area defined by $CIE_X$=0.450 to 0.600, $CIE_Y$=0.400 to 0.550, such that when a line is drawn between the first point and the second point, it passes through a desired white area defined on the CIE 1931 XYZ color space chromaticity diagram to be within $CIE_X$=0.315 to 0.350, $CIE_Y$=0.330 to 0.360; and
  wherein a concentration of the first and second organic emitting materials is such that the light produced by the first light source is at a third point on the CIE1931 XYZ color space chromaticity diagram that is within the desired white area.

13. The first device of claim 11, wherein the first and second organic emitting materials comprise phosphorescent emitters.

14. The first device of claim 11, wherein the first organic emitting material comprises a fluorescent emitter and the second organic emitting material comprises a phosphorescent emitter.

15. The first device of claim 1, wherein the first light source comprises a stacked organic light emitting device (SOLED).

16. The first device of claim 1, wherein the first light source comprises three organic emitting materials, a first organic emitting material, a second organic emitting material, and a third organic emitting material.

17. The first device of claim 16, wherein the first organic emitting material emits blue light that has a first point on the CIE 1931 XYZ color space chromaticity diagram within a first area defined by $CIE_X$=0.100 to 0.200, $CIE_Y$=0.050 to 0.300;
  wherein the second organic emitting material emits green light that has a second point on the CIE 1931 XYZ color space chromaticity diagram within a second area defined by $CIE_X$=0.200 to 0.400 $CIE_Y$=0.600 to 0.750;
  wherein the third organic emitting material emits red light that has a third point on the CIE 1931 XYZ color space chromaticity diagram within a third area defined by $CIE_X$=0.600 to 0.720, $CIE_Y$=0.280 to 0.400;
  such that a fourth area is defined by a line that is drawn between the first point and the second point, the second point and the third point, and the third point and the first point that includes a desired white area defined on the CIE 1931 XYZ color space chromaticity diagram to be within $CIE_X$=0.315 to 0.350, $CIE_Y$=0.330 to 0.360; and
  wherein a concentration of the first, second, and third organic emitting materials is such that the light produced by the first light source is at a fourth point on the CIE 1931 XYZ color space chromaticity diagram that is within the desired white area.

18. The first device of claim 16, wherein the first, second, and third organic emitting materials comprise phosphorescent emitters.

19. The first device of claim 16, wherein the first organic emitting material comprises fluorescent emitters and the second and third organic emitting materials comprise phosphorescent emitters.

20. The first device of claim 1, wherein each of the first, second, third, and fourth sub-pixels has an aperture size, and wherein the aperture size of the fourth sub-pixel is larger than the aperture size of each of the first, second, and third sub-pixels.

21. The first device of claim 20, wherein the aperture size of the fourth sub-pixel is between approximately 10 % and 300 % larger than the aperture size of each of the first, second, and third sub-pixels.

22. The first device of claim 1, wherein each of the first, second, third, and fourth sub-pixels has an aperture size, and wherein the aperture size of the fourth sub-pixel is smaller than the aperture size of each of the first, second, and third sub-pixels.

\* \* \* \* \*